(12) United States Patent
Minor

(10) Patent No.: US 7,062,397 B1
(45) Date of Patent: Jun. 13, 2006

(54) RECURSIVE CALIBRATION

(75) Inventor: James M. Minor, Los Altos, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 11/021,927

(22) Filed: Dec. 23, 2004

(51) Int. Cl.
- *G01D 18/00* (2006.01)
- *G01P 21/00* (2006.01)
- *G01R 31/00* (2006.01)

(52) U.S. Cl. .......................... 702/90; 702/85

(58) Field of Classification Search ................ 702/85, 702/87, 88, 90, 107, 109, 117, 119, 120; 324/130, 324/601, 602, 606, 607
See application file for complete search history.

(56) References Cited

U.S. PATENT DOCUMENTS

| | | | |
|---|---|---|---|
| 4,583,298 A | 4/1986 | Raugh | |
| 5,798,947 A | 8/1998 | Ye et al. | |
| 5,860,917 A | 1/1999 | Comanor et al. | |
| 2005/0253574 A1* | 11/2005 | Summers | 324/158.1 |
| 2005/0259764 A1* | 11/2005 | Hung Lai et al. | 375/317 |
| 2005/0276289 A1* | 12/2005 | Kim et al. | 372/29.01 |

OTHER PUBLICATIONS

Diamantaras et al., Principal Component Neural Networks, Theory and Application, John Wiley & Sons, Inc., pp. 146-157, 1996.

Hobbs et al., "FASTUS: A Cascaded Finite-State Transducer for Extracting Information form Natural-Language Text", pp. 1-22, 1992.

Lawson et al., Calibration Algorithms for an Electron Beam Metrology System, Microelectronic Engineering pp. 41-50, 1983.

Marquardt, "An Algorithm for Least-Squares Estimation of Nonlinear Parameters", J Soc Indust Appl Math vol. II, No. 2, USA pp. 431-441, Jun., 1963.

Manning & Schutze, Foundations of Statistical Natural Language Processing, MIT Press 1st ed., pp. xxix-xxxiii, 1999.

Minor, James M. et al., "Analysis of Clinical Data Using Neutural Nets", J. Biopharmaceutical Statistics, 6(1), 83-104, 1996.

Minor, James M. et al., "Neural Net Methods for Mapping Thermodynamic and Physical Properties in Environmental Problems", Abstract submitted to 1996 AIChE Spring National Meeting, New Orleans, LA, Feb. 25-29, 1996.

(Continued)

*Primary Examiner*—Michael Nghiem

(57) ABSTRACT

Methods, systems and computer readable media for calibrating a device for which it is not possible to provide another device having a higher degree of precision to be used as a standard against which the device to be calibrated can be compared to perform the calibration. Metrology for interpreting the input and output fields and monitoring and supervising tasks of the device, and having sufficient accuracy, may be used to facilitate calibration.

23 Claims, 5 Drawing Sheets

OTHER PUBLICATIONS

Minor, James M. et al., "Use of Neural Networks to Analyze Drug Combination Interactions," submitted to COMCON4, 4th International Conference on Advances in Communication & Control Proceedings, pp. 504-515, 1993.

Minor et al., "Competetive Advantage via Advanced Technology: Neural Networks and Quality Control", Abstract and Article submitted to 1995 Quality Control Conference, Santa Clara, CA, Apr. 4-7, 1995.

Rizvi., "Let's Begin to Standardize Registration Metrology," Semiconductor International, pp. 136-141, Oct. 1989.

Raugh, M.R., "Absolute two-dimensional sub-micron metrology for electron beam lithography: A calibration theory with applications," Precision Engineering, 7(1), pp. 3-13 Jan. 1985.

Raugh, M.R., "Self-Consistency and Transitivity in Self-Calibration Procedures", Stanford University Computer Systems Laboratory Technical Report CSL-TR-91-484, pp. 1-53, Jul. 1991.

Raugh., Two-dimensional stage self-calibration: Role of symmetry and invariant sets of points. J.Vac. Sci.Technol. B, vol. 15, No. 6, pp. 2139-2145, Dec. 1997.

Raugh., Self-calibration of Interferometer Stages: Mathematical Techniques for Deriving Lattice Algorithms for Nanotechnology pp. 1-31 and A1-E11, Mar. 2002.

Sumney., "Preparing for the SRC's Second Decade" Semiconductor Reserch Corporation, vol. 10, No. 1, pp. 1-12, Jan., 1992.

* cited by examiner

RECURSIVE CALIBRATION

BACKGROUND OF THE INVENTION

Calibration of measurement tools and scientific instrumentation typically involves the use of another tool that has a higher degree of precision than the tool(s) or instrument(s) to be calibrated. Using such a "reference", "standard" or "gold standard" tool of higher precision, measurements taken by the tool or instrument to be calibrated can be compared with measurements of the reference tool that has a higher degree of precision, and adjusted accordingly, to match the measurements of the higher precision tool as closely as possible. This not only increases the precision of each tool or instrument compared to and adjusted according to the reference tool, but it also standardizes the measurements of the tools and instruments so adjusted, so that they produce measurement results similarly to one another. However, for tools and instruments on the cutting edge of the limits of precision, this approach is no longer possible, since a tool having greater precision does not exist, and therefore some other technique, tool and/or method is needed to calibrate such tools and instruments. This need arises, among other areas, in areas where the discipline requires the ability to measure smaller and smaller units, such as distance, volume, or other unit of measurement, as the discipline progresses over time. Examples of such disciplines include semiconductor technologies, such as VLSI design and manufacturing, transistor design and manufacturing etc. A discipline that has been immediately faced with such need is the field of nanotechnology.

Nano-machines are typically at the limits of technology with regard to the units of measurement that can be detected and worked with by such machines. Therefore, it is impossible to provide a "reference" tool of the type described above, that could be used to calibrate such nano-machines.

An example of a conventional self-calibration technique useful for improving accuracy in the alignment of masks used in making integrated circuits via electron beam lithography is disclosed in U.S. Pat. No. 4,583,298 to Raugh, which is incorporated herein, in its entirety, by reference thereto. Raugh uses the concept of symmetry to calibrate a rigid plate by first placing the rigid plate in a reference orientation and measuring the locations of points in a grid on the calibration plate to establish reference measurements. After that, the rigid plate is repositioned into "non-reference" orientations, and for each non-reference orientation, the locations of the points in the grid are again measured. A calibration map is used to determine calibrated measured values for each orientation for each grid point. Numerical values are then set for parameters to minimize deviation from the congruence of each orientation of the rigid plate with all other orientations measured. Raugh determined that single or multiple rotations of the rigid plate about a single point cannot give complete self-calibration, since a rotationally symmetric distortion would look the same in all rotated orientations, and therefore would not be detectable as an error. The same holds for translations which, alone, are ineffective in identifying translationally invariant distortions. However, using rotational displacement of the rigid plate and a translation displacement, or another rotation about a different point, makes it possible to self-calibrate according to Raugh's technique.

Ye et al., in U.S. Pat. No. 5,798,947, which is incorporated herein in its entirety, by reference thereto, also addresses self-calibration of lithography stages. A mapping of a two-dimensional array of stage positions to corresponding positions in a Cartesian coordinate grid is made to determine distortion therebetween. The mapping function is performed by a series of orthogonal Fourier series functions to decouple the determination of a pivoting point and a rotation angle from the determination of the distortion function. An operation is performed to determine complete non-four-fold rotationally symmetric distortion between the two-dimensional array of stage positions and the Cartesian coordinate grid from measured locations of marks in an original orientation to locations having been rotated by ninety degrees. A translation operation is also performed to take further distortion measurements and to determine incomplete non-four-fold rotationally symmetric distortion.

However, when applying the above self-calibration techniques, the rotations and translations required introduce errors themselves, as the amount of rotation and/or translation is not exact at the level of precision of the tool. Therefore replicate symmetry operations of the object in the input field of the tool are required to reduce error of its mean symmetrical locations. The object must span the entire input field of the tool to assure complete calibration. This is a requirement that must be met by Design Of Experiments (DOE) in order to leverage all possibilities of the domain of the application, wherein, in this case, the domain is the device input field for machines.

SUMMARY OF THE INVENTION

Methods, systems and computer readable media are provided for calibrating a device for which it is not possible to provide another device having a higher degree of precision to be used as a standard against which the device to be calibrated can be compared to perform the calibration. Such methods, systems and computer readable media may include performance of comparing machine instructions used by the device to reproduce a current input as a current output, with machine instructions that were used by the device to reproduce the current input as the previous output, based on a previous input; determining error based upon results from the comparison, and determining whether calibration of the device has been successfully completed, based on errors determined by the determination of error, wherein if errors between the machine instructions used to produce the current output and the machine instructions used to produce the previous output are within predetermined thresholds, then it is determined that the calibration has been successfully completed, and wherein if it is not determined that the calibration has been successfully completed, adjustment of one or more operational parameters of the device is performed, and the current output is used as an input to iterate the comparison of machine instructions.

Methods, systems and computer readable media are provided for calibrating a device that replicates and reduces an input to a scale for which it is not possible to provide another device having a higher degree of precision to be used as a standard against which the device to be calibrated can be compared to perform the calibration, including: using a metrology system to measure an error pattern of a current output produced as a nano-scale reproduction of a current input by the device based on inputting the current input to the device; transforming the error pattern back to a scale equal to a scale of the current input; comparing a pattern of the current input with the transformed error pattern; aligning the error pattern with the pattern of the current input by linear regression; and determining whether calibration has been successfully completed, wherein if all errors within the error pattern are less than or equal to one or more predetermined error thresholds, then it is determined that successful calibration has been completed.

Methods, systems and computer readable media are provided for calibrating a device for which it is not possible to provide another device having a higher degree of precision to be used as a standard against which the device to be calibrated can be compared to perform the calibration. In one embodiment performance of such calibration includes: inputting a representative sample as a current input to the device to be calibrated; converting the current input to machine instructions used by the device to reproduce the current input as an output; outputting the reproduction of the current input as a current output; adjusting one or more operational parameters of the device with at least one adjustment to attempt to reduce recursive errors in the machine instructions; inputting the current output from said outputting the reproduction as a current input to the device to be calibrated; repeating the converting and outputting steps based upon the current input; comparing the machine instructions from the current converting step to machine instructions produced by the most recent previous converting step; and determining that the calibration of the device has been successfully completed when errors between the machine instructions from the current converting step and the machine instructions produced by the most recent previous converting step are within predetermined error tolerances, or adjusting one or more operational parameters of the device, and then repeating the inputting the current output, and repeating the converting and outputting, and comparing steps when the errors are not within said predetermined error tolerances.

Methods, systems and computer readable media are provided for calibrating a device that replicates and reduces an input to a scale for which it is not possible to provide another device having a higher degree of precision to be used as a standard against which the device to be calibrated can be compared to perform the calibration, including: inputting a representative sample as a current input to the device to be calibrated; converting the current input to a current output based on current machine settings of the device to reproduce the current input as an output and wherein the output is scaled down to nano-dimensions; outputting a nano-scale reproduction of the current input as a current output; measuring an error pattern of the current output with a metrology system; transforming the error pattern back to a scale equal to a scale of the current input; comparing a pattern of the current input with the input pattern; aligning the error pattern with the pattern of the current input by linear regression; if one or more errors within the error pattern are greater than predetermined error thresholds, adjusting one or more machine settings of device to be calibrated to form current machine settings for a next recursive cycle; repeating the inputting, converting, outputting, measuring, transforming, comparing, aligning and adjusting steps to perform additional recursive cycles until current errors are all within the predetermined error thresholds or until a predetermined recursion cycle limit has been met.

Forwarding, transmitting and/or receiving a result obtained from any of the methods described herein are also disclosed.

These and other advantages and features of the invention will become apparent to those persons skilled in the art upon reading the details of the methods, systems and computer readable media as more fully described below.

DETAILED DESCRIPTION OF THE INVENTION

Figure 1:
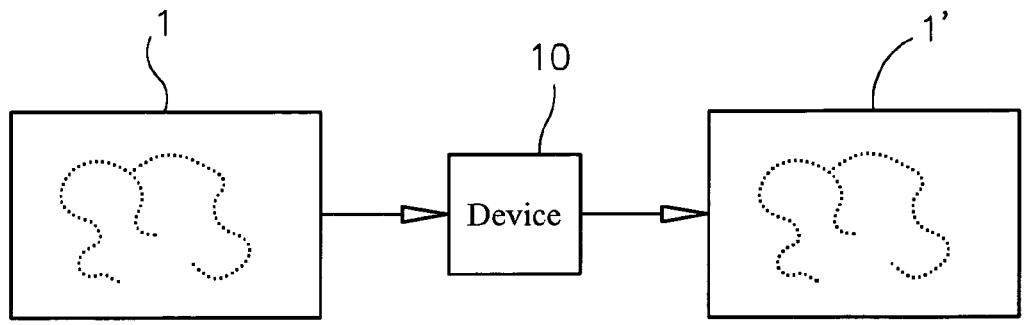
FIG. 1 is a block diagram representing a device being used to take an input from an input field 1 and to produce an output at output field 1' that is theoretically identical to the input in input field 1.

Before the present systems, methods and computer readable media are described, it is to be understood that this invention is not limited to particular examples or technologies described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "and", and "the" include plural referents unless the context clearly dictates otherwise. Thus, for example, reference to "a device" includes a plurality of such devices and reference to "the input" includes reference to one or more inputs and equivalents thereof known to those skilled in the art, and so forth.

The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed.

Definitions

An "artifact standard" as used herein, refers to an input object that, when inputted, causes a device into which the artifact standard has been inputted to produce an output object. Based upon the known properties of the artifact standard, the exact properties of a theoretical output that is perfectly produced based on the artifact standard as input are known. These exact, theoretical properties are useful as targets that can be goals of a calibration of the device. As one non-limiting example, an artifact standard may be a pattern created specifically so that when inputted, the artifact standard causes a device into which the artifact standard has been inputted, to produce an output object, such as a pattern. Another non-limiting example of an artifact standard is a liquid sample having a know composition or certain known properties, from which the desired, theoretical exact composition or respective properties of an output can be determined as a goal against which calibrations are performed. The output object, matched with the artifact standard can be used to calibrate the device. Errors in the device performance are to be minimized by the calibration protocol/design of the device, assuming the provision of an adequate metrology system that can measure the performance of the device.

A "device" as used herein refers to a machine, tool, instrument or other apparatus that may be calibrated according to the techniques described herein.

"Linear error" as corrected by calibrations according to the present techniques, may include rotations, lateral shifts and/or size changes when comparing an output to an input.

The terms "nano-scale", "nano-scale dimensions" "nano dimensions" or "nano-scale measurements" as used herein, refer to a measurement scale on the order of $10^{-6}$ or less of the normal unit for that scale. Thus, for example a nano-scale for fluids could be micro liters or less, whereas distance measurement may be carried out in micrometers down to nanometers or less, etc. In general, regardless of scale, the present invention pertains to calibration of devices that cannot have a reliable "gold" standard against which calibration can be based upon, and where metrology enables monitoring of the performance of the device.

A "nano-device" as used herein, refers to a nano-machine, nano-tool, nano-instrument, or the like that operates on a very small scale, e.g., nano-scale. For example, for a "lab-on-a-chip" or microfluidic devices, a nano-liquid chromatographer may accept liquid inputs with volume ranging from tens of nanoliters down to less than a nanoliter. As another example, a nano-machine used to measure distances may measure distances on the order of 10's or hundreds of nanometers down to less that 1 nanometer.

When one item is indicated as being "remote" from another, this is referenced that the two items are at least in different buildings, and may be at least one mile, ten miles, or at least one hundred miles apart.

"Communicating" information references transmitting the data representing that information as signals (e.g., electrical, optical, radio or other signal media) over a suitable communication channel (for example, a private or public network).

"Forwarding" an item refers to any means of getting that item from one location to the next, whether by physically transporting that item or otherwise (where that is possible) and includes, at least in the case of data, physically transporting a medium carrying the data or communicating the data.

A "processor" references any hardware and/or software combination which will perform the functions required of it. For example, any processor herein may be a programmable digital microprocessor such as available in the form of a mainframe, server, or personal computer. Where the processor is programmable, suitable programming can be communicated from a remote location to the processor, or previously saved in a computer program product. For example, a magnetic or optical disk may carry the programming, and can be read by a suitable disk reader communicating with each processor at its corresponding station.

Reference to a singular item, includes the possibility that there are plural of the same items present.

"May" means optionally.

Methods recited herein may be carried out in any order of the recited events which is logically possible, as well as the recited order of events.

All patents and other references cited in this application, are incorporated into this application by reference except insofar as they may conflict with those of the present application (in which case the present application prevails).

The present methods, systems and computer readable media new invention do not make any assumptions about the shape, size, location or symmetry of an input to be acted upon, but only require that the input object adequately spans the input field of the device. For example, the input field may be covered with a calibration artifact (grid) that satisfies Niquist criterion for adequate grid density that captures all input patterns inherent to the domain of the application of the machine/device. As noted, no assumptions about shape, size, location or symmetry are necessary.

Turning now to FIG. 1, a schematic representation is shown in which a device is used to take an input from an input field 1 and to output an output field 1' that is theoretically an identical representation of the input field 1. Of course, in the real world, 1' is never identical to 1 due to noise, machine error and/or a variety of other error sources. However, it is desirable to make 1' as nearly identical to 1 as possible, which is the subject of the need to calibrate device 10. A non-limiting, yet concrete example of field 1 would be a circuit, such as an IC circuit board to be reproduced for use in cellular telephones, for example, that is to be mass reproduced (1'). In order to function properly and not have short circuits or disconnected circuits, the circuit pattern 1 needs to be accurately reproduced at 1'.

For applications where the dimensions of the subject in the input field 1 to be reproduced are very small, such as in some fields of semiconductor manufacturing and nanotechnology fields, microfluidics, etc., a standard calibration tool cannot be provided to calibrate device 10, because device 10 is already at the limits of precision which are technologically possible at the time. Typically, what may be done in such cases, is to place an artifact standard in the input field 1 that is designed to be useful in calibrating the device 10 given the output 1' that results after inputting the artifact standard. Global bias may be induced by positioning the artifact slightly askew, rotated, or otherwise out of the intended position in the input field 1. The types of global errors that result from such global biases are easily corrected by software running simple transforms, as every location in the output at output field 1' will be similarly distorted by the same type of global error.

Assuming that device 10 is already properly calibrated (within tolerable limits of precision and accuracy) then if the output 1' is used for the next input 1 into device 10, the new output should be substantially the same (within the referenced tolerable limits) as the previous output 1' which was currently used as an input. Thus, if correctly calibrated, the errors made by this repetition will be negligibly small, so as to give essentially the same output. However, even for small errors, these errors can be analyzed and addressed, if desired by recursively inputting the previous output of the same device, since for bias type errors, the device will further exacerbate the same errors with each repetition and thus magnify those repeatable bias-type errors.

Figure 2A:
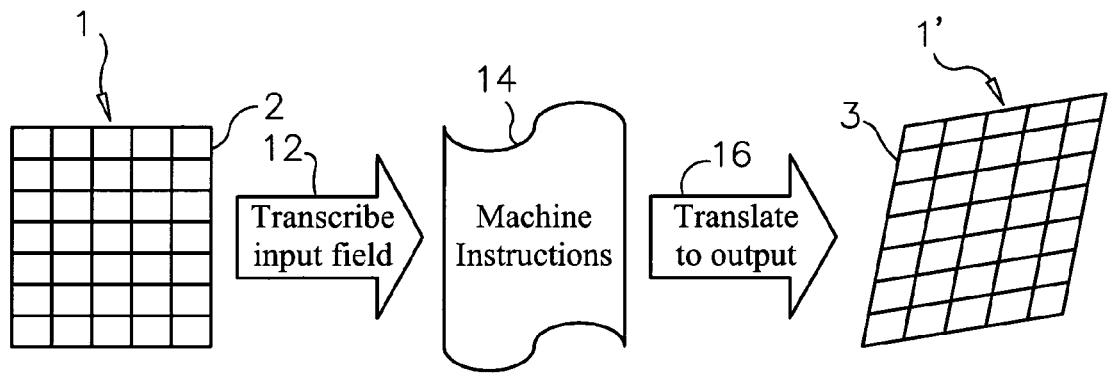
FIGS. 2A and 2B are flow diagrams illustrating recursive processing for carrying out calibration as one embodiment of the present invention.
Figure 2B:
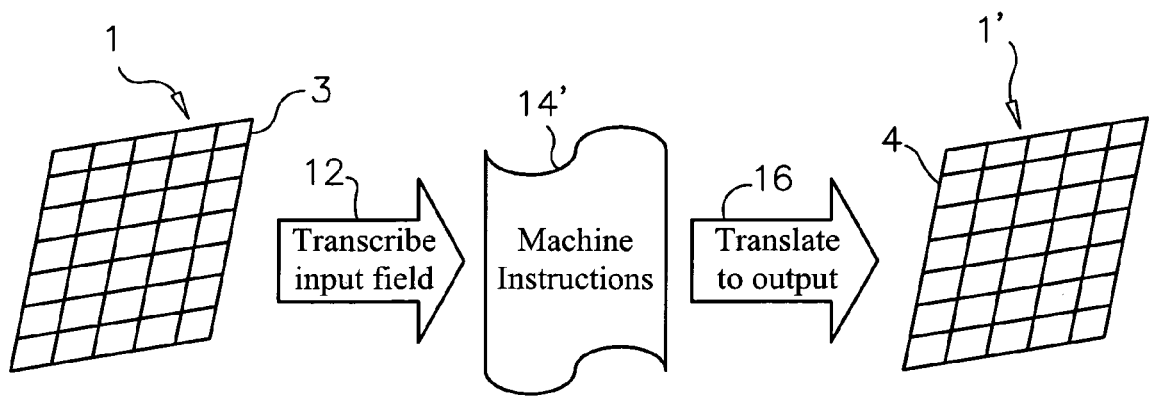

FIGS. 2A and 2B are flow diagrams illustrating recursive processing for carrying out calibration as described. In FIG. 2A, an artifact standard 2 is placed in input field 1 for processing by machine or device 10. The artifact standard 2 is transcribed 12 into an appropriate format that is readable by the device or machine 10. For example, machine instructions may be written, based upon the input received in the input field 1, that are then used by the device 10 to produce an output intended to be an identical reproduction of the input. Then device or machine 10 creates commands or instructions that attempt to produce a result or product 3 that is geometrically similar to artifact standard 2. Additional simple transforms create congruency, e.g., as to scaling, translation and rotation of the points making up output product 3 when compared with artifact standard 2. These are easily estimated with high precision, even if given distortions of an un-calibrated machine. Least squares regression may be calculated, for example, to minimize total error between two recursion command lists from the device's metrology. One then reduces this corrected error by adjusting device calibration parameters. The corrected commands are then used to make an object for another recursion step unless the error between command lists has become adequately small or a limit cycle is detected, in which case the best possible calibration has been achieved, given the device's calibration design. Thus, the inputted and transcribed data as processed in accordance with the machine instructions, are translated 16 to an output of the form 3.

Using the recursive strategy outlined above, the transformed product 3 may be put into the input field 1 as an artifact and transcribed 12 for processing by the same device or machine 10. Excluding the simple transforms, an un-calibrated machine 10 will add a further distortion to the artifact of the same type added when transforming 2 to 3, and thus will amplify this type of distortion. On the other hand, excluding the simple transforms (which adjust for misalignment of the artifact in the input field, for example, as discussed above), an adequately calibrated machine will replicate the input pattern within tolerances. FIG. 2B shows an example where machine instructions 14' have been modified to account for the distortions evident when comparing 3 with 2. The resultant output 4 confirms that the modified machine instructions have successfully calibrated the machine or device 10, since the comparison of 4 with 3 shows substantially the same pattern, within tolerances. On the other hand, such comparisons will also identify when an attempted correction or calibration to modify machine instructions results in greater error, and this will indicate that adjustments, modifications need to made differently than the manner in which they were previously made for the current comparison.

Hence, recursion enables amplification of machine distortions. Such recursions, as they are repeated, can subsequently validate a calibrated device as defined by its hardware and software design. Upon inputting a prior output so as to carry out another step in the recursive process, the new input may be rotated, translated, or otherwise globally skewed with respect to the input field, if not placed exactly correctly with respect to the input field. Errors caused by such misplacement result in global errors in the next output, which are not really calibration errors since they are not due to errors on the part of machine or device 10. Further, non-calibration errors of these types are easily correctable by software, as all points/locations in the field can be corrected in the same manner (e.g., by a rotation, a translation, etc.)

Each device 10 includes a metrology system that reads the input field 1, transcribes the input field 12 and creates a list of machine instructions 14, via its metrology system, that machine, instrument or device 10 uses to create the output. Accordingly, by modifying the list of instructions 14' the instrument, machine or device 10 can be calibrated to alter the output to a form that is within acceptable tolerances. Referring again to FIGS. 2A and 2B, when output 3 from FIG. 2A is inputted to device 10 in the next recursive step (FIG. 2B), if the machine instructions 14 generated from transcribing 12 the input 4 in input field 1 do not match the machine instructions 14 (FIG. 2A) generated from transcribing 12 the input 2 in input field 1 during the previous run/pass of machine 10, this indicates error that is outside of the limits of tolerance.

Object mis-location, e.g., unavoidable error in exact placement and orientation in the input field may be calculated by least squares regression to minimize total error between two adjacent recursion command lists from the device's metrology. Corrected error may then be reduced by adjusting device calibration parameters. The corrected commands may then be used to make an object for another recursion step unless the errors between command lists have become adequately small or a limit cycle is detected, in which case the best possible calibration has been achieved given the device's calibration design and optionally, the limit cycle.

Multiple runs/passes can be made in this manner, along with adjustments of the machine, device or instrument 10 made between runs, in an effort to converge upon machine instructions 14 that are substantially the same from one pass to the next successive pass. Alternatively, multiple runs/passes may be carried out in an effort to converge upon machine instructions that are substantially the same from one pass to the next successive pass (i.e., errors adequately small, less than a threshold or cutoff value) but the number of runs/passes may be ended when a limit cycle is set. A limit cycle may be valuable in situations where a poor design of calibration knobs or other calibration means are provided making it effectively impossible to converge to a desired error tolerance, or other reasons why the error is not reducible to within the tolerance limits. For nano-scale applications, the input field may not only be reproduced as the output, but the output may be scaled down to a much smaller size than the input field. This is true in semiconductor applications as well. For example, with electron lithography, a circuit design that may be roughly the size of a person's hand may be inputted in the input field 1, and then reduced to a nano-scale size (on the order of nanometers) at the output field 1'. Stepper-repeater lithography may be used to manufacture nano-scale semiconductor circuits on wafers from a tablet size circuit design, for example. An example of such stepper-repeater lithography is described in more detail below. Least squares regression may be employed to make corrections on a global scale between metrology lists/objects outputted therefrom. When replicating and reducing, scaling is involved. Scaling is one of the global adjustments that may easily be made to an input field, such as by using software methods, as discussed above. For example, if output 3 in FIG. 2A is scaled down by a factor of 10,000 relative to input 2, then when output 3 is used as an input in FIG. 2B, it will be scaled up by a factor of 10,000 during inputting and processing by the machine 10 in the next pass, and then it will be scaled down again by a factor of 10,000 when producing output 4.

As an example of a nano-machine, machine 10 may be in the field of microfluidics, such as a nano-scale liquid chromatograph. The liquid chromatograph includes a detector component that emits a response due to the eluting sample compound passing through the chromatograph, and subsequently signals a peak on the chromatogram. It is positioned immediately posterior to the stationary phase of the chromatograph in order to detect the compounds as they elute from the column. The detector output is what the current processes aim to calibrate. A sample is passed through the liquid chromatograph and the detector output is read and/or stored. The same sample (whether collected from the output of device 10 or whether an additional sample from a larger volume of the sample) is inputted into machine 10 for another pass. By recursively applying samples as inputs, with adjustment/calibration of the detector in between passes, the liquid chromatograph may be adjusted to converge toward consistent readings, within tolerance levels. Note that the "correct answer" or "correct output" does not need to be known for this application. Unlike the lithography example, where the exact circuit pattern is known, and thus there is an "exact answer" or "correct output" against which to judge comparisons of recursive outputs against, the sample may be unknown, and the comparisons may rather be made among the outputs to determine when the machine has been correctly calibrated.

The same processes may be used to help with research and development to improve a nano-scale liquid chromatograph or other nano-scale machine. By comparing outputs of such a machine, these processes may determine whether the nano-scale machine is functioning properly and/or when a nano-machine has been improved or worsened by a change in design.

Minimization of the errors identified during a recursion process described above (i.e., minimization of the recursion errors) produced by device coordinates, metrology specifications and/or values, or the like (e.g., machine instructions as converted to device commands) serves to calibrate device, machine or instrument 10. A grid array of points may be used as an input object to calibrate a device/machine. In such a case the machine upon reading the grid array of points inputted, generates commands to reproduce the array. The command may be a list of locations (coordinates) for the output field of the machine, for example. Hence, when a corrected device can reproduce its output artifact within specified tolerances, or when a recursion cycle limit has been reached, it is considered calibrated within the span or coverage of the artifact pattern, and no further adjustments and/or input and output cycles are carried out, since the calibration is determined to have concluded. SLS™ technology can efficiently functionalize the final correction map for calibrating the device 10, see U.S. Pat. No. 5,860,917 and application Ser. No. 10/400,372, both of which are hereby incorporated herein, in their entireties, by reference thereto.

Figure 3:
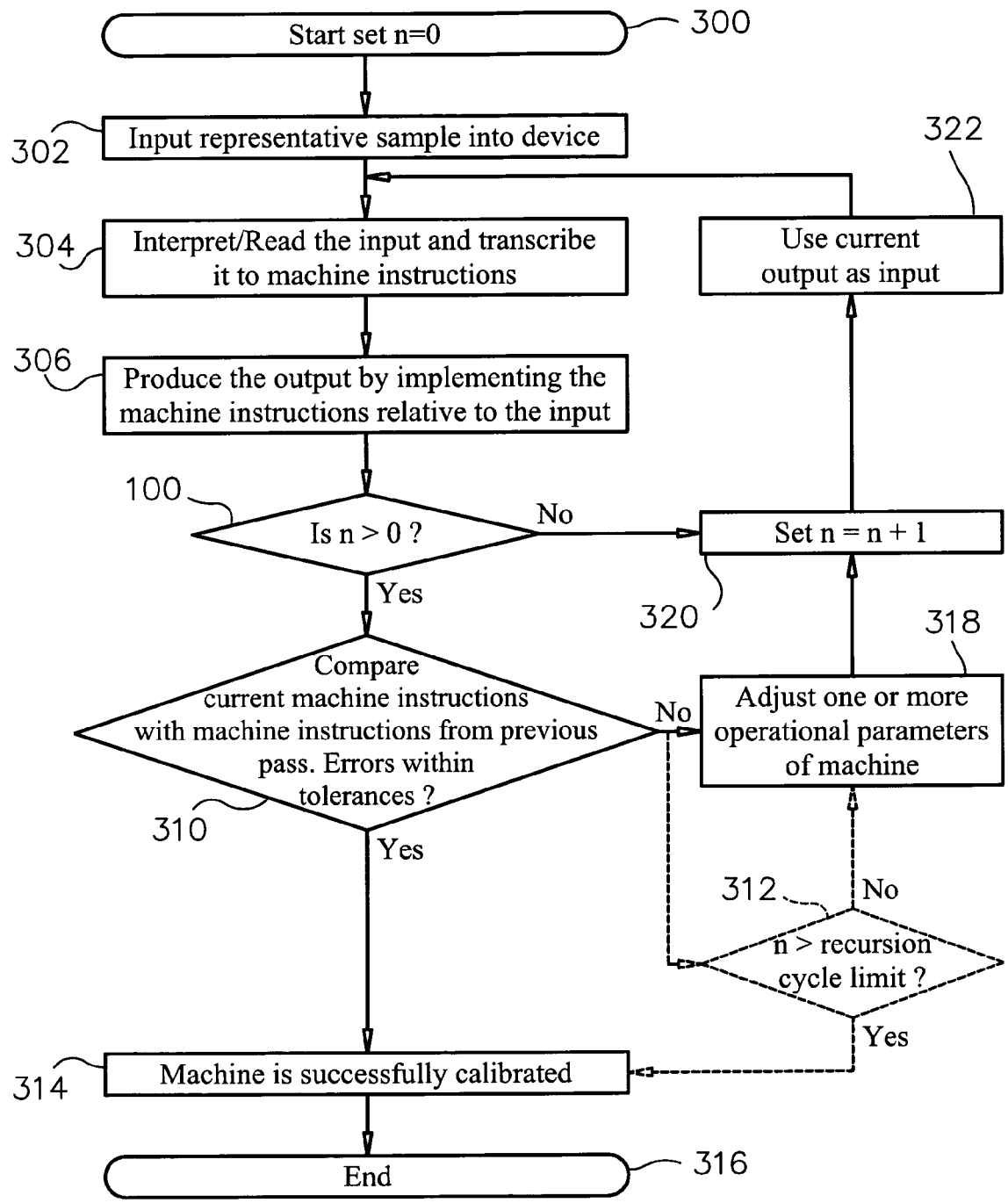
FIG. 3 is a flow chart illustrating event that may be carried out for calibration by a recursive technique, at least a portion of which may be automated, as one example of the present invention.

Referring now to FIG. 3, a flowchart is shown to describe calibration by a recursive technique, at least a portion of which may be automated, as one example of the present invention. At event 300 a counter "n" is set to zero and the process begins. At event 302, a representative sample is inputted to a device 10 to be calibrated. Typically, the sample will be within the operational scale of the device and may be designed (through design of experiment) to cover all, nearly all, or some predefined range of the operational scale of the device 10. While it may be preferred to cover the entire range of the operational scale, this may not always be possible, so that two or more samples covering overlapping and complementary ranges of the operational scale may be used, wherein the currently described process would be carried out for each of the samples relied upon for the calibration. As noted earlier, it is not necessary to know the exact composition or make up of the sample in order to perform the calibration.

At event 304, the metrology system of device 10 interprets or reads the input sample and transcribes it to a set of machine instructions. The machine instructions are run by device 10 to convert the input to the output, e.g., as a reproduction of the input sample, or as some other product that the device is designed to produce given a particular type of input. If n=0 at event 308 then this is indicative of the first pass, so no comparisons of data can be made. Accordingly, the counter n is set to n+1 at event 320 and the output from the pass or run just completed is used as an input for the next run/pass at event 322. Events 304 and 306 are then repeated only with use of the new input. Since this is no longer the first run, processing at event 308 is advanced to event 310 where the machine instructions from the current run are compared with the machine instructions from the most recent previous run and bias errors are identified by the differences in the machine instructions. Since metrology accurately measures performance, recursions in performance produce errors in metrology, e.g., device instructions/commands. Corrections are inputted according to provisions made by the hardware for calibration (e.g., calibration knobs, software adjustments, etc.).

The identified errors are then compared against a set of acceptance error tolerances for the particular device and particular type of functions that are intended to be carried out with the device. If the errors are within the specified tolerances, then the device is considered to have been successfully calibrated at event 314 and calibration processing ends at event 316. On the other hand, if at least one identified error is out of the range of acceptable tolerances, then, if a recursion cycle limit has been optionally set for this run, it is determined at event 312 whether or not the recursion cycle limit has been met. If the recursion cycle limit has been met, then the device is considered to have been successfully calibrated at event 314 and calibration processing ends at event 316. Alternatively, if the recursion cycle has been met, then processing may be paused to wait for intervention by a human operator to determine whether calibration has been successful. If, on the other hand, the recursion cycle limit has not been met or no recursion cycle limit has been set, then the device is further adjusted as to one or more operational parameters of the device at event 318 in an effort to improve the precision of at least one functional aspect of the device to try and bring all errors within acceptable tolerances. Counter n may optionally be incremented at event 320 when it is desired to keep a count of the total number of recursions, or event 320 may be skipped at this stage, since n is already greater than zero, so that a comparison for errors will be made with each recursion henceforth.

At event 322, the most current output is again used as an input, and another recursive pass is carried out in the same manner above. These recursive passes may be continued until all errors are determined to be within tolerances during one pass at event 310. Alternatively, the system may be set to carry out a predetermined number of recursive passes, so that when n reaches that predetermined number, processing will pause or stop for further input/intervention by a human operator.

Still further, the present techniques may be used in conjunction with symmetry techniques in order to perform calibration, by using symmetry-corrected objects recursively as the input with the present process.

Figure 4:
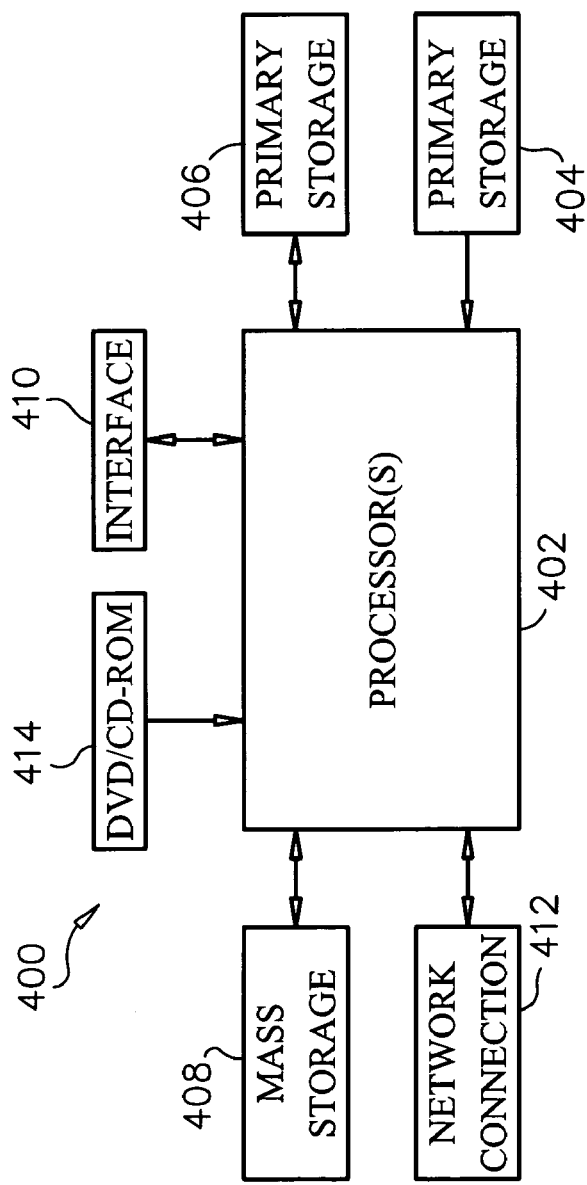
FIG. 4 is a block diagram illustrating an example of a generic computer system which may be used in implementing the present invention.

FIG. 4 illustrates a typical computer system 400 that may be used in processing events described herein. The computer system 400 includes any number of processors 402 (also referred to as central processing units, or CPUs) that are coupled to storage devices including primary storage 406 (typically a random access memory, or RAM), primary storage 404 (typically a read only memory, or ROM). As is well known in the art, primary storage 404 acts to transfer data and instructions uni-directionally to the CPU and primary storage 406 is used typically to transfer data and instructions in a bi-directional manner Both of these primary storage devices may include any suitable computer-readable media such as those described above. A mass storage device 408 is also coupled bi-directionally to CPU 402 and provides additional data storage capacity and may include any of the computer-readable media described above. Mass storage device 408 may be used to store programs, data and the like and is typically a secondary storage medium such as a hard disk that is slower than primary storage. It will be appreciated that the information retained within the mass storage device 408, may, in appropriate cases, be incorporated in standard fashion as part of primary storage 406 as virtual memory. A specific mass storage device such as a CD-ROM 414 (or DVD-ROM, CD-RW, DVD-RW, or the like) may also pass data uni-directionally to the CPU.

CPU 402 is also coupled to an interface 410 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 402 optionally may be coupled to a computer or telecommunications network using a network connection as shown generally at 412. With such a network connection, it is contemplated that the CPU might receive information from the network, or might output information to the network in the course of performing the above-described method steps. The above-described devices and materials will be familiar to those of skill in the computer hardware and software arts.

The hardware elements described above may implement the instructions of multiple software modules for performing the operations of this invention. For example, machine instructions may be compared by one or more processors 402, and/or may be stored on mass storage device 408 or 414 and subsequently executed on a CPU 402 in conjunction with primary memory 406. It is noted that features of embodiments of the present systems may be implemented with hardware, software, firmware, or combinations thereof.

In addition, embodiments of the present invention further relate to computer readable media or computer program products that include program instructions and/or data (including data structures) for performing various computer-implemented operations. The media and program instructions may be those specially designed and constructed for the purposes of the present invention, or they may be of the kind well known and available to those having skill in the computer software arts. Examples of computer-readable media include, but are not limited to, magnetic media such as hard disks, floppy disks, and magnetic tape; optical media such as CD-ROM, CD-RW, DVD-ROM, or DVD-RW disks; magneto-optical media such as floptical disks; and hardware devices that are specially configured to store and perform program instructions, such as read-only memory devices (ROM) and random access memory (RAM). Examples of program instructions include both machine code, such as produced by a compiler, and files containing higher level code that may be executed by the computer using an interpreter.

EXAMPLE

The following example is put forth so as to provide those of ordinary skill in the art with a complete disclosure and description of how to make and use the present invention, and is not intended to limit the scope of what the inventor regards as his invention nor is it intended to represent that the experiment below is the only experiment performed. Efforts have been made to ensure accuracy with respect to numbers used (e.g. amounts, temperature, etc.) but some experimental errors and deviations should be accounted for. Unless indicated otherwise, parts are parts by weight, molecular weight is weight average molecular weight, temperature is in degrees Centigrade, and pressure is at or near atmospheric.

Figure 5A:
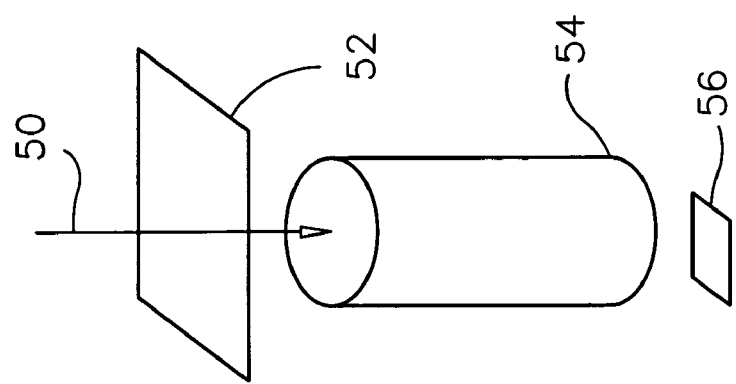
FIG. 5A is a schematic representation of hardware for carrying out stepper-repeater recursive calibration according to the present invention.

Referring now to FIG. 5A, a schematic representation of hardware for carrying out stepper-repeater recursive calibration is shown. Light 50 is passed through reticle 52 on which a circuit layout is contained, to project an image of the circuit layout. As light 50 pases through lens 54, the image of the circuit layout is reduced to nano-scale dimensions and projected/exposed on the surface of silicon wafer 56. Due to lens imperfections in lens 54, a uniform grid of points on a calibration reticle 52 will not be uniform on the wafer 56, and this has the potential to cause circuit defects in circuits imprinted on the wafer, unless corrections of the imperfections are brought to within tolerable limits.

Figure 5B:
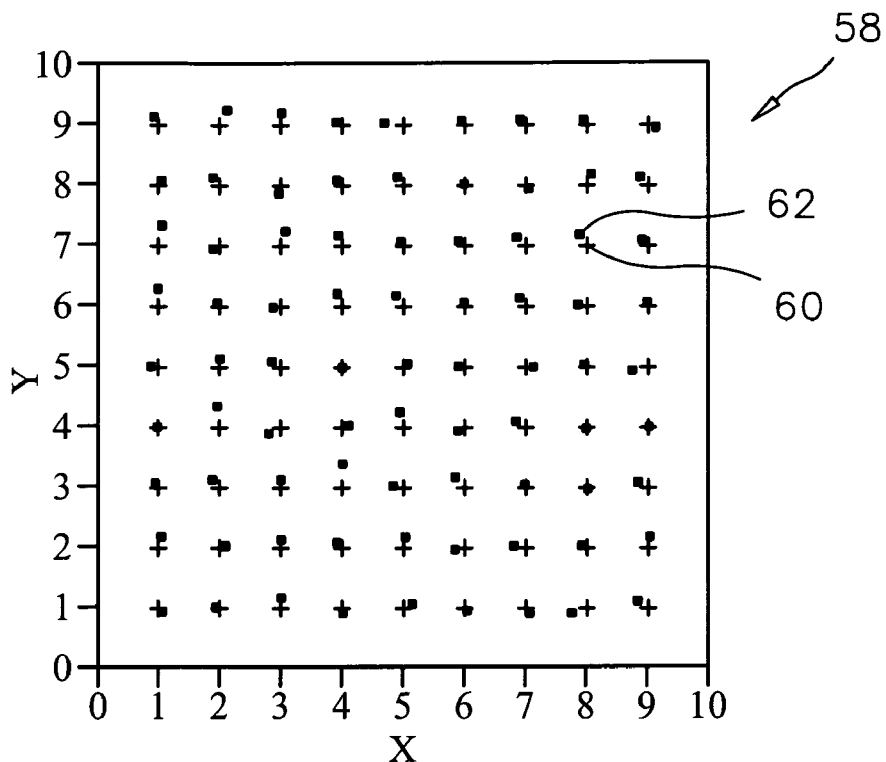
FIG. 5B is a schematic representation of an error diagram produced by comparing an original circuit layout with an error pattern.

The metrology system measures the error pattern projected onto wafer 56 and transforms/enlarges the error pattern back to the dimensions of the circuit layout originally contained on reticle 52. By comparing the original circuit layout with the error pattern, an error diagram 58 may be produced as shown in FIG. 5B. As shown, the crosshairs 60 represent the locations of the original points included on the circuit layout, and the dots 62 represent the points in the relative positions measured on the wafer image.

An additional reticle grid made from the dot locations 62 may be imaged on wafer 56 to add a second level of lens distortions. This recursion not only amplifies local lens distortions but also provides curvilinear ($2^{nd}$ order nonlinear) information. The enhanced error patterns resulting from this step may be used to modify the lens surface, (e.g., change the curvature thereof) to ready it for another round of distortion evaluation. Alternatively, the error patterns may be used to inverse distort the original reticle circuit layout so that the wafer image is improved.

Recursion calibration does not require that the grid pattern (e.g., circuit layout) on reticle 52 be uniform, but only requires that the pattern adequately cover the input field, i.e., the active reticle surface imaged on wafer 56. Since whole-image translations, rotations, and magnification are linear transformations, one can optimally align the wafer nano-image pattern with the reticle pattern in order to calculate the true lens distortion-error pattern. Linear regression aligns the machine/device output to the input. Such whole-image alignment can be done via least squares regression. Note that in this example, the reticle grid coordinates are in effect the device/machine command list to the lens 54 to create and project the image on wafer 56.

Figure 5C:
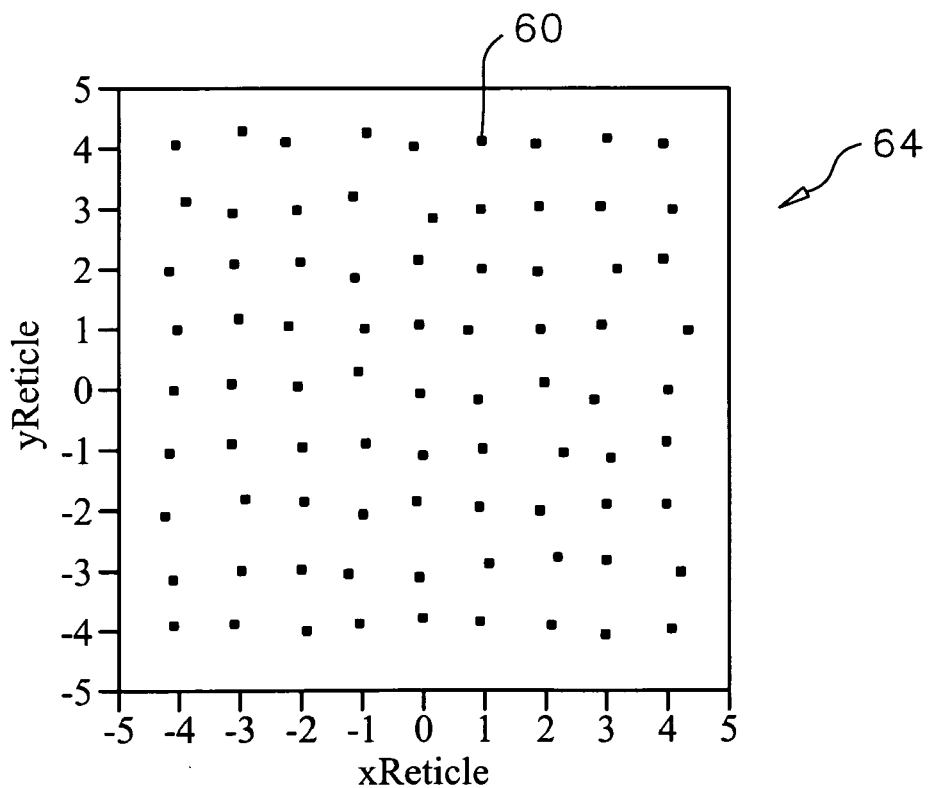
FIG. 5C is a schematic representation of an original reticle pattern used as the original input on the reticle of the hardware of FIG. 5A.
Figure 5D:
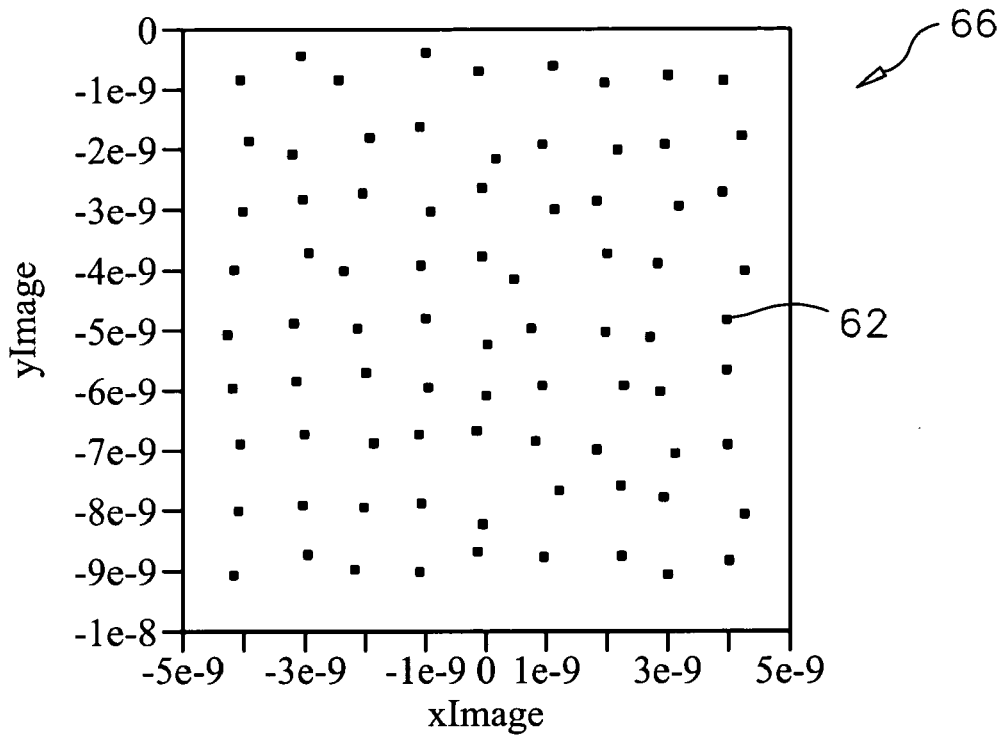
FIG. 5D is a schematic representation of a nano-scale image fo the pattern of FIG. 5C that was produced on a wafer as an output from the hardware of FIG. 5A.
Figure 5E:
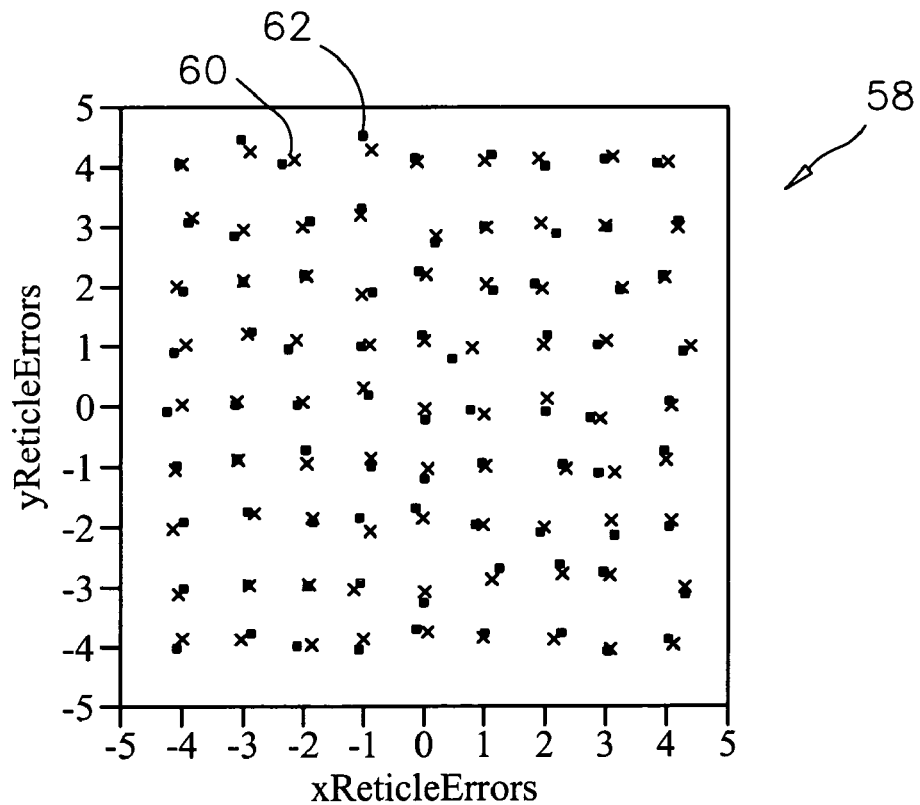
FIG. 5E shows an error diagram produced in the manner described above, where crosshairs indicate the relative locations of the points on the reticle pattern, and dots indicate the relative locations of the points on the outputted image, after transforming to the same scale as the reticle pattern.

FIG. 5C shows an original reticle pattern 64 that was on reticle 52, to produce the nano-scale image 66 (FIG. 5D) on wafer 56 in the manner discussed above. FIG. 5E shows an error diagram produced in the manner described above, where crosshairs 60 indicate the relative locations of the points on the reticle pattern 64, and the dots 62 indicate the relative locations of the points on the image 66, after transformation/re-enlargement to the same scale as the reticle pattern 64. Least square regression was used to remove the image-wide linear distortions and map the pattern back to reticle scale to reveal lens local distortion as shown in FIG. 5E. A summary of the calculations carried out when performing least squares regression is shown in the Table below.

The units of measurement for the above equations were meters (at the reticle/input end) and nanometers at the wafer (output) end. The metrology must be better than the device performance, however, the invention is not scale bound and therefore not limited to the units of measure described.

By applying the corrections identified in the above equations, global misalignments in the output image with regard to the input at the reticle weremoved, thereby optimizing recusrion adjacency so that regional distortions (i.e., errors) were manifested.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

What is claimed is:

1. A method for calibrating a device for which it is not possible to provide another device, having a higher degree of precision, to be used as a standard against which the device to be calibrated can be compared to perform the calibration, said method comprising the steps of:

inputting a representative input to the device to be calibrated;

converting the input to machine instructions used by the device to reproduce the input as an output;

outputting the reproduction of the input as a current output;

TABLE

| Response xReticle | | | | | Response yReticle | | | | |
|---|---|---|---|---|---|---|---|---|---|
| Summary of Fit | | | | | Summary of Fit | | | | |
| RSquare | | 0.998398 | | | RSquare | | 0.998388 | | |
| RSquare Adj | | 0.998357 | | | RSquare Adj | | 0.998347 | | |
| Root Mean Square Error | | 0.106268 | | | Root Mean Square Error | | 0.105812 | | |
| Mean of Response | | 0.002146 | | | Mean of Response | | 0.016762 | | |
| Observations (or Sum Wgts) | | 81 | | | Observations (or Sum Wgts) | | 81 | | |
| Parameter Estimates | | | | | Parameter Estimates | | | | |
| Term | Estimate | Std Error | t Ratio | Prob > \|t\| | Term | Estimate | Std Error | t Ratio | Prob > \|t\| |
| Intercept | −0.005182 | 0.025376 | −0.20 | 0.8387 | Intercept | 4.9323806 | 0.025267 | 195.21 | <.0001 |
| xImage | 995735354 | 4516804 | 220.45 | <.0001 | xImage | −2974019 | 4497400 | −0.66 | 0.5104 |
| yImage | −2458216 | 4530166 | −0.54 | 0.5889 | yImage | 991435411 | 4510705 | 219.80 | <.0001 |

The above results enabled statistically derived global linear mappings to match the ouput image with the input at the reticle as follows:

$$xReticle = -0.005182 + 995735354 * xImage - 2458216 * yImage$$

$$yReticle = 4.9323806 - 2974019 * xImage + 991435411 * yImage$$

where x Reticle is the x-coordinate of the input on the reticle, y Reticle is the y-coordinate of the input on the reticle, x Image is the x-coordinate of the image at the output, and y Image is the x-coordinate of the image at the output.

adjusting one or more operational parameters of the device with at least one adjustment to reduce recursive errors in the machine instructions;

inputting the output from said outputting the reproduction as a current input to the device to be calibrated;

repeating said converting and outputting steps based upon the current input;

comparing the machine instructions from a current converting step to machine instructions produced by a previous converting step; and determining that the calibration of the device has been successfully completed when errors between the machine instructions from a current converting step and the machine instructions produced by a previous converting step are within predetermined error tolerances, or adjusting one or more operational parameters of the device, and then repeating said inputting the current output, repeating said converting and outputting, and comparing steps when said errors are not within said predetermined error tolerances.

2. The method of claim 1, wherein said representative input comprises signals representing properties of a representative sample.

3. The method of claim 1, wherein said comparing comprises comparing machine instruction from the current converting step to machine instructions produced by a most recent previous converting step.

4. The method of claim 1, further comprising determining that the calibration of the device has been successfully completed when a recursion cycle limit has been met, or pausing when the recursion cycle limit has been met, until a human operator intervenes.

5. The method of claim 1, further comprising symmetrically correcting the current output with respect to the current input, prior to inputting the current output as a current input for the next cycle of processing.

6. The method of claim 1, wherein the device is designed to receive inputs having or representative of nano-scale dimensions, and wherein said representative sample is an artifact standard.

7. The method of claim 1, further comprising correcting global bias errors in said current output produced by positioning said current input out of alignment with an intended position of input to the device.

8. The method of claim 1, wherein said step of comparing employs least squares regression to minimize linear error between the machine instructions from the current converting step to machine instructions produced by the most recent previous converting step.

9. A method of calibrating a device comprising the steps of:
  inputting a representative sample as a current input to the device to be calibrated;
  converting the current input to a current output based on current machine settings of the device to reproduce the current input as an output and wherein the output is scaled down to nano-dimensions;
  outputting a nano-scale reproduction of the current input as a current output;
  measuring an error pattern of said current output with a metrology system;
  transforming the error pattern back to a scale equal to a scale of the current input;
  comparing a pattern of the current input with the transformed error pattern;
  aligning the error pattern with the pattern of the current input by linear regression;
  if one or more errors within the error pattern are greater than predetermined error thresholds, adjusting one or more machine settings of device to be calibrated to form current machine settings for a next recursive cycle; and
  repeating said inputting, converting, outputting, measuring, transforming, comparing, aligning and adjusting steps to perform additional recursive cycles until current errors are all within said predetermined error thresholds or until a predetermined recursion cycle limit has been met.

10. The method of claim 9, wherein the device is configured to replicate and reduce an input to a scale for which it is not possible to provide another device having a higher degree of precision to be used as a standard against which the device to be calibrated can be compared to perform the calibration.

11. The method of claim 9, wherein said aligning the error pattern with the pattern of the current input is carried out by least squares regression.

12. The method of claim 9, wherein an additional input sample is created based on said transformed error pattern and inputted, converted and outputted to create a second level error pattern to amplify observed errors.

13. The method of claim 9, wherein the device is a stepper-repeater apparatus and the current machine settings include a curvature of a reticle lens.

14. A system for calibrating a device for which it is not possible to provide another device having a higher degree of precision to be used as a standard against which the device to be calibrated can be compared to perform the calibration, said system comprising:
  a processor and programming to perform the functions of:
  comparing machine instructions used by the device to reproduce a current input as a current output, with machine instructions that were used by the device to reproduce the current input as the previous output, based on a previous input;
  determining error based upon results from said comparing; and
  determining whether calibration of the device has been successfully completed, based on errors determined by said determining error, wherein if errors between the machine instructions used to produce the current output and the machine instructions used to produce the previous output are within predetermined thresholds, then it is determined that the calibration has been successfully completed, and wherein if it is not determined that the calibration has been successfully completed, adjustment of one or more operational parameters of the device is performed, and the current output is used as an input to iterate the comparison of machine instructions.

15. The system of claim 14, wherein said determining whether calibration of the device has been successfully completed determines that calibration has been successfully completed a recursion cycle limit has been met.

16. The system of claim 14, wherein said determining whether calibration of the device has been successfully completed pauses the system when a recursion cycle limit has been met, until a human operator intervenes.

17. The system of claim 14, wherein said processor further symmetrically corrects the current output with respect to the current input, prior to inputting the current output as a current input for the next cycle of processing.

18. The system of claim 14, wherein the device is designed to receive inputs having or representative of nano-scale dimensions, and wherein said representative sample is an artifact standard.

19. The system of claim 14, wherein said comparing comprises applying least squares regression to minimize linear error between the machine instructions from the current converting step to machine instructions produced by a previous converting step.

20. A system used to calibrate a device that replicates and reduces an input to a scale for which it is not possible to provide another device having a higher degree of precision to be used as a standard against which the device to be calibrated can be compared to perform the calibration, said system comprising:

a processor and programming to perform the functions of:
inputting a representative sample as a current input to the device to be calibrated; converting the current input to a current output based on current machine settings of the device to reproduce the current input as an output and wherein the output is scaled down to nano-dimensions; and outputting a nano-scale reproduction of the current input as a current output; and a metrology system for measuring an error pattern of a current output produced as a nano-scale reproduction of a current input by the device based on inputting the current input to the device;

wherein said processor transforms the error pattern back to a scale equal to a scale of the current input;

compares a pattern of the current input with the transformed error pattern;

aligns the error pattern with the pattern of the current input by linear regression; and determines whether calibration has been successfully completed, wherein if all errors within the error pattern are less than or equal to one or more predetermined error thresholds, then it is determined that successful calibration has been completed.

21. The system of claim 20, wherein if one or more errors is greater than the one or more predetermined error thresholds, and an iteration cycle limit has not been met, it is determined that calibration has not been successfully completed, and adjustment of one or more machine settings of the device to be calibrated are recommended to form current machine settings for a next recursive cycle.

22. The system of claim 20, wherein said aligning the error pattern with the pattern of the current input is carried out by least squares regression.

23. A computer readable medium comprising one or more sequences of instructions, wherein execution of one or more sequences of instructions by one or more processors causes the one or more processors to perform the steps of:

comparing machine instructions used by a device to reproduce a current input as a current output, with machine instructions that were used by the device to reproduce the current input as the previous output, based on a previous input;

determining error based upon results from said comparing; and determining whether calibration of the device has been successfully completed, based on errors determined by said determining error, wherein if errors between the machine instructions used to produce the current output and the machine instructions used to produce the previous output are within predetermined thresholds, then it is determined that the calibration has been successfully completed, and wherein if it is not determined that the calibration has been successfully completed, adjustment of one or more operational parameters of the device is performed, and the current output is used as an input to iterate the comparison of machine instructions.

* * * * *

UNITED STATES PATENT AND TRADEMARK OFFICE
CERTIFICATE OF CORRECTION

| | | |
|---|---|---|
| PATENT NO. | : 7,062,397 B1 | Page 1 of 1 |
| APPLICATION NO. | : 11/021927 | |
| DATED | : June 13, 2006 | |
| INVENTOR(S) | : Minor | |

It is certified that error appears in the above-identified patent and that said Letters Patent is hereby corrected as shown below:

On the Title page, in Item (56), under "Other Publications", in column 2, line 5, after "Engineering" insert -- , --.

On the Title page, in Item (56), under "Other Publications", in column 2, line 8, delete "vol." and insert --Vol.--, therefor.

On the Title page, in Item (56), under "Other Publications", in column 2, line 8, delete "No." and insert --no.--, therefor.

On the Title page, in Item (56), under "Other Publications", in column 2, line 9, after "USA" insert -- , --.

On the Title page, in Item (56), under "Other Publications", in column 2, line 14, delete "Neutural" and insert -- Neutral --, therefor.

Signed and Sealed this

Ninth Day of January, 2007

JON W. DUDAS
*Director of the United States Patent and Trademark Office*